(12) United States Patent
Nansei

(10) Patent No.: US 8,896,051 B2
(45) Date of Patent: Nov. 25, 2014

(54) SEMICONDUCTOR DEVICE AND METHOD FOR MANUFACTURING THE SAME

(75) Inventor: Hiroyuki Nansei, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 13/601,061

(22) Filed: Aug. 31, 2012

(65) Prior Publication Data

US 2013/0228848 A1 Sep. 5, 2013

(30) Foreign Application Priority Data

Dec. 20, 2011 (JP) ................. 2011-278991

(51) Int. Cl.
*H01L 29/792* (2006.01)
*H01L 27/115* (2006.01)
*H01L 21/768* (2006.01)
*H01L 21/28* (2006.01)

(52) U.S. Cl.
CPC .......... *H01L 29/792* (2013.01); *H01L 27/1157* (2013.01); *H01L 21/76805* (2013.01); *H01L 21/28282* (2013.01); *H01L 27/11575* (2013.01); *H01L 27/11582* (2013.01); *H01L 21/76831* (2013.01); *H01L 21/76816* (2013.01)
USPC ............................ 257/324; 438/668; 438/639

(58) Field of Classification Search
CPC ...................... H01L 27/1157; H01L 27/11575; H01L 27/11582; H01L 21/76805
USPC ............................ 438/637, 639, 668; 257/324
See application file for complete search history.

(56) References Cited

U.S. PATENT DOCUMENTS

| 7,799,672 B2* | 9/2010 | Hashimoto et al. | ............ 438/618 |
| 2009/0242968 A1* | 10/2009 | Maeda et al. | ................. 257/324 |
| 2010/0133599 A1 | 6/2010 | Chae et al. | |
| 2010/0207186 A1* | 8/2010 | Higashi et al. | ................ 257/314 |
| 2010/0207240 A1 | 8/2010 | Hashimoto et al. | |
| 2010/0213526 A1 | 8/2010 | Wada et al. | |
| 2011/0031546 A1 | 2/2011 | Uenaka et al. | |
| 2011/0031630 A1 | 2/2011 | Hashimoto | |

FOREIGN PATENT DOCUMENTS

| JP | 2010-192646 A | 9/2010 |
| JP | 2010-199311 A | 9/2010 |
| JP | 2011-35237 A | 2/2011 |
| JP | 2011-35343 A | 2/2011 |
| JP | 2011-60958 A | 3/2011 |

* cited by examiner

*Primary Examiner* — Daniel Luke
*Assistant Examiner* — Pavel Ivanov
(74) *Attorney, Agent, or Firm* — Oblon, Spivak, McClelland, Maier & Neustadt, L.L.P.

(57) ABSTRACT

According to one embodiment, a semiconductor device includes a lower layer connection object, a stacked body, an insulating film, and a via. The stacked body has a plurality of insulating layers and a plurality of electrode layers alternately stacked on the lower layer connection object. The stacked body has a staircase structure unit. The via connects uppermost electrode layer at each step of the staircase structure unit and the lower layer connection object through the via hole. The via has an upper part provided on and in contact with a top face of the uppermost electrode layer, and a penetrating part provided to be thinner than the upper part inside the insulating film in the via hole. The penetrating part connects the upper part and the lower layer connection object.

13 Claims, 14 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2011-278991, filed on Dec. 20, 2011; the entire contents of which are incorporated herein by reference.

FIELD

Embodiments described herein relate generally to a semiconductor device and a method for manufacturing the same.

BACKGROUND

There is proposed a memory device having memory cells three-dimensionally arranged therein by forming a memory hole on a stacked body having a plurality of electrode layers functioning as a control gate in a memory cell and a plurality of insulating layers alternately stacked and, after forming a charge storage film on a side wall of the memory hole, providing silicon to be a channel in the memory hole.

In addition, as a structure for connecting each of a plurality of stacked electrode layers to an interconnection of another layer, there is proposed a structure having a via connected to each of the plurality of electrode layers processed into a staircase shape.

DETAILED DESCRIPTION

Figure 1:
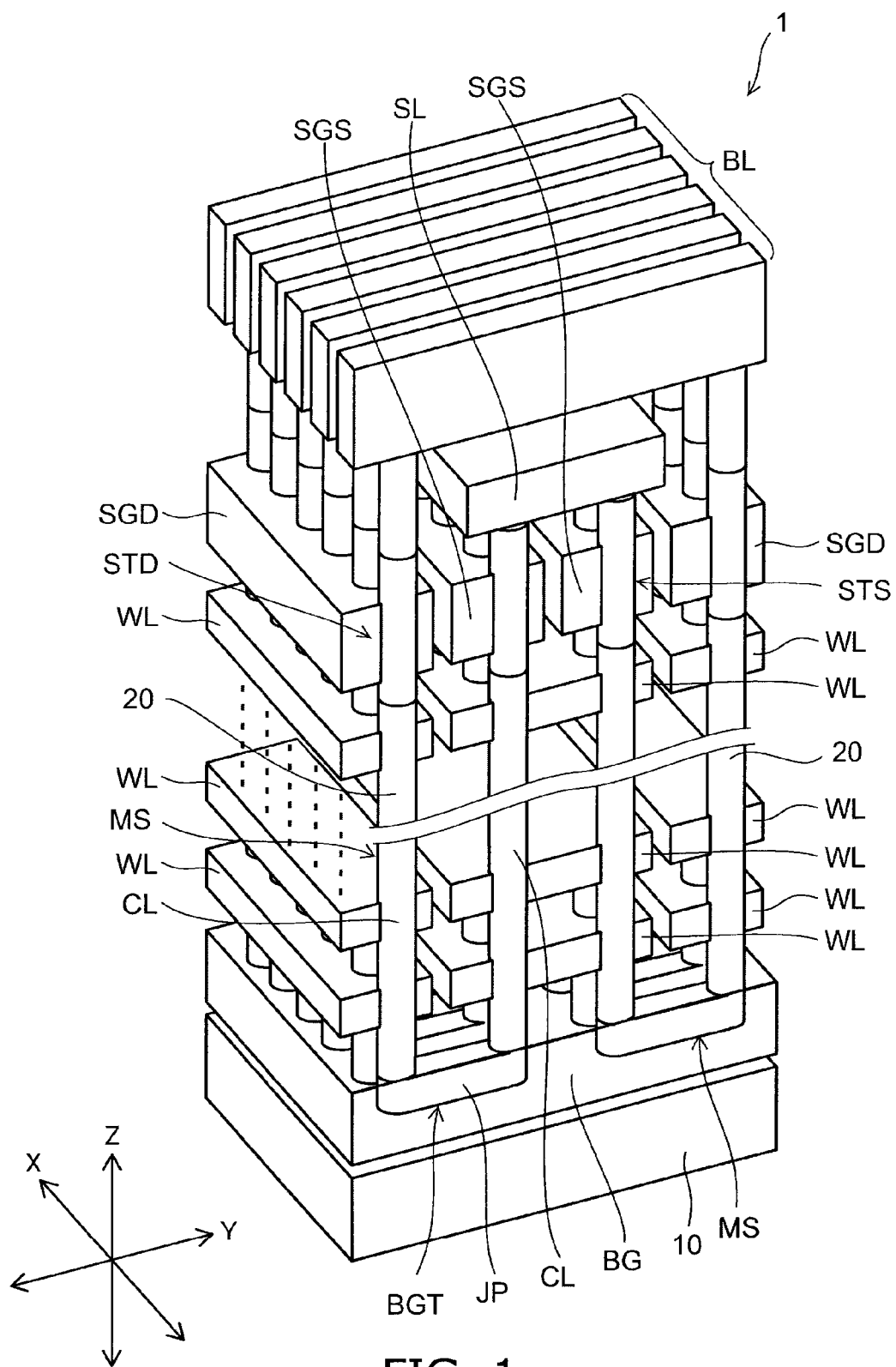
FIG. 1 is a schematic sectional view of a memory cell array of a semiconductor device of an embodiment.

According to one embodiment, a semiconductor device includes a lower layer connection object, a stacked body, an insulating film, and a via. The stacked body has a plurality of insulating layers and a plurality of electrode layers alternately stacked on the lower layer connection object. The stacked body has a staircase structure unit in which the plurality of electrode layers are processed into a staircase shape. The insulating film is provided on a side wall of a via hole penetrating through the staircase structure unit to reach the lower layer connection object. The via connects uppermost electrode layer at each step of the staircase structure unit and the lower layer connection object through the via hole. The via has an upper part provided on and in contact with a top face of the uppermost electrode layer, and a penetrating part provided to be thinner than the upper part inside the insulating film in the via hole. The penetrating part connects the upper part and the lower layer connection object.

Embodiments of the invention will now be described with reference to the drawings. In the drawings, same components are marked with like reference numerals.

FIG. 1 is a schematic perspective view of a memory cell array 1 in a semiconductor device of an embodiment. In FIG. 1, insulated parts are not shown for clarity.

Figure 2:
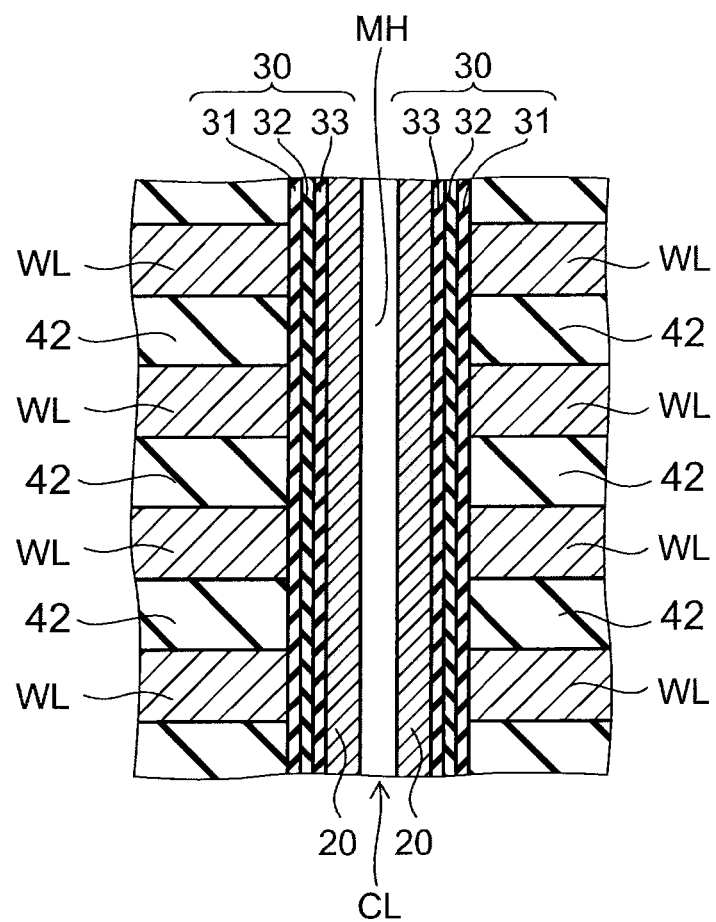
FIG. 2 is an enlarged sectional view of a columnar portion of a memory string shown in FIG. 1.

FIG. 2 is an enlarged cross-sectional view of the major part of FIG. 1.

Additionally, in FIG. 1, the XYZ orthogonal coordinate system is introduced for convenience. In the coordinate system, two directions parallel to the major surface of a substrate 10 and perpendicular to each other are defined as the X- and Y-directions, and direction perpendicular to both the X- and Y-directions is defined as the Z-direction.

On the substrate 10, a back gate BG is provided. For example, a conductive silicon layer having impurities doped therein can be used as the back gate BG.

On the back gate BG, a plurality of insulating layers 42 (shown in FIG. 2) and a plurality of electrode layers WL are alternately stacked.

For example, a conductive silicon layer having impurities doped therein can be used as the electrode layer WL. For example, an insulating material including silicon oxide can be used for the insulating layer 42.

On the uppermost electrode layer WL in the memory cell array 1, a drain-side selection gate SGD or a source-side selection gate SGS is provided. For example, a conductive silicon layer having impurities doped therein can be used as the drain-side selection gate SGD and the source-side selection gate SGS.

The drain-side selection gate SGD and the source-side selection gate SGS are separated along the Y-direction. The electrode layer WL stacked under the drain-side selection gate SGD and the electrode layer WL stacked under the source-side selection gate SGS are also separated along the Y-direction.

On the source-side selection gate SGS, a source line SL is provided. A metal layer, for example, can be used as the source line SL.

On the drain-side selection gate SGD and the source line SL, a plurality of bit lines BL which are metal interconnections are provided. Each of the bit lines BL extends along the Y-direction.

On the back gate BG and the stacked body on the back gate BG, a plurality of U-shaped channel bodies 20 are formed. The channel body 20 has a columnar part CL penetrating through the drain-side selection gate SGD and the electrode layer WL thereunder, a columnar part CL penetrating through the source-side selection gate SGS and the electrode layer WL thereunder, and a joint part JP connecting the lower ends of the pair of columnar parts CL. The joint part JP is provided in the back gate BG.

The channel body 20 is provided in a U-shaped memory hole MH via a memory film 30 (shown in FIG. 2). A silicon film, for example, can be used as the channel body 20. The memory film 30 is provided between the inner wall of the memory hole MH and the channel body 20, as shown in FIG. 2.

A gate insulating film (not shown) is provided between the drain-side selection gate SGD and the channel body 20, and between the source-side selection gate SGS and the channel body 20.

Although FIG. 2 illustrates a structure provided with the channel body 20 so that a hollow remains at the side of the central axis of the memory hole MH, the entire memory hole MH may be filled with the channel body 20, or a structure in which the hollow inside the channel body 20 is filled with an insulator will do.

As shown in FIG. 2, a block film 31 as a first insulating film, a charge storage film 32, and a tunnel film 33 as a second insulating film are provided, in this order from the electrode layer WL side, between each electrode layer WL and the channel body 20 in a memory cell transistor (simply referred to as memory cell in the following). The block film 31 is in contact with the electrode layer WL, the tunnel film 33 is in contact with the channel body 20, and the charge storage film 32 is provided between the block film 31 and the tunnel film 33.

The channel body 20 functions as a channel in the memory cell, the electrode layer WL functions as a control gate, and the charge storage film 32 functions as a data storage layer which accumulates electric charge injected from the channel body 20. In other words, a memory cell having a structure with a control gate surrounding the periphery of the channel is formed at the intersecting part of the channel body 20 and each electrode layer WL.

The semiconductor device of the embodiment is a nonvolatile semiconductor storage device which can electrically and freely erase or write data, and maintain the memory content even if the power is shut down.

The memory cell is a charge trap memory cell, for example. A silicon nitride film, for example, can be used as the charge storage film 32 having a large number of trap sites which capture electric charge.

The tunnel film 33, for which a silicon oxide film can be used, for example, functions as a potential barrier when electric charge is injected into the charge storage film 32 from the channel body 20 or when electric charge accumulated in the charge storage film 32 diffuses to the channel body 20.

The block film 31, for which a silicon oxide film can be used, for example, prevents the electric charge accumulated in the charge storage film 32 from diffusing to the electrode layer WL.

The drain-side selection gate SGD, the channel body 20, and a gate insulating film therebetween form a drain-side selection transistor STD. The channel body 20 in the drain-side selection transistor STD is connected to the bit line BL.

The source-side selection gate SGS, the channel body 20, and a gate insulating film therebetween form a source-side selection transistor STS. The channel body 20 in the source-side selection transistor STS is connected to the source line SL.

The back gate BG, the channel body 20 provided in the back gate BG, and the memory film 30 form a back gate transistor BGT.

A plurality of memory cells having each electrode layer WL as a control gate thereof are provided between the drain-side selection transistor STD and the back gate transistor BGT. Similarly, a plurality of memory cells having each electrode layer WL as a control gate thereof are provided between the back gate transistor BGT and the source-side selection transistor STS.

The plurality of memory cells, the drain-side selection transistor STS, the back gate transistor BGT, and the source-side selection transistor STS are connected in series through the channel body 20 to form a single U-shaped memory string MS. By arranging a plurality of the memory strings MS along the X-direction and the Y-direction, a plurality of memory cells MC are provided three-dimensionally along the X-, Y-, and the Z-directions.

The memory cell array 1 shown in FIG. 1 is provided in a memory cell array region on the substrate 10. On the surface of the substrate 10, a control circuit for controlling the memory cell array 1 is formed. The control circuit is formed on the surface of the substrate 10 around the memory cell array region, or on the surface of the substrate 10 under the memory cell array region. Each of the electrode layers WL is electrically connected to the control circuit via a staircase structure unit 2 shown in FIG. 3.

Figure 3:
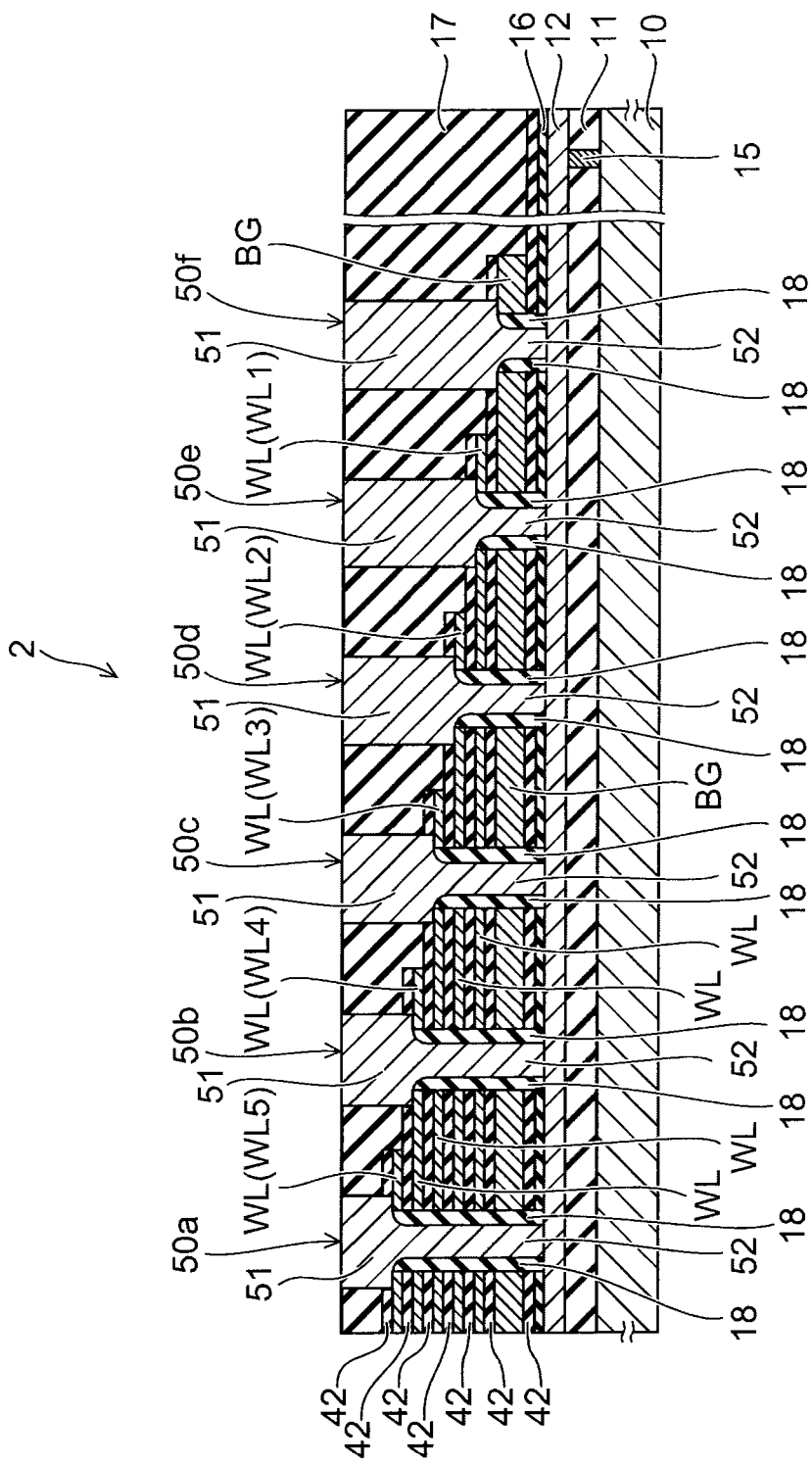
FIG. 3 is a schematic sectional view of a staircase structure unit of a semiconductor device of a first embodiment.

FIG. 3 is a schematic cross-sectional view of the staircase structure unit 2 of a first embodiment.

The stacked body 1 including the back gate BG, the plurality of insulating layers 42, and the plurality of electrode layers WL described above is also formed in a contact region outside the memory cell array region in the X-direction in one chip, with the staircase structure unit 2 provided on a stacked body in the contact region.

In the contact region shown in FIG. 3, a lower layer interconnection 12 is provided on the substrate 10 via the insulating layer 11. The lower layer interconnection 12 is a lower layer connection object to which each electrode layer WL and the back gate BG are connected through vias 50a to 50f.

Figure 4:
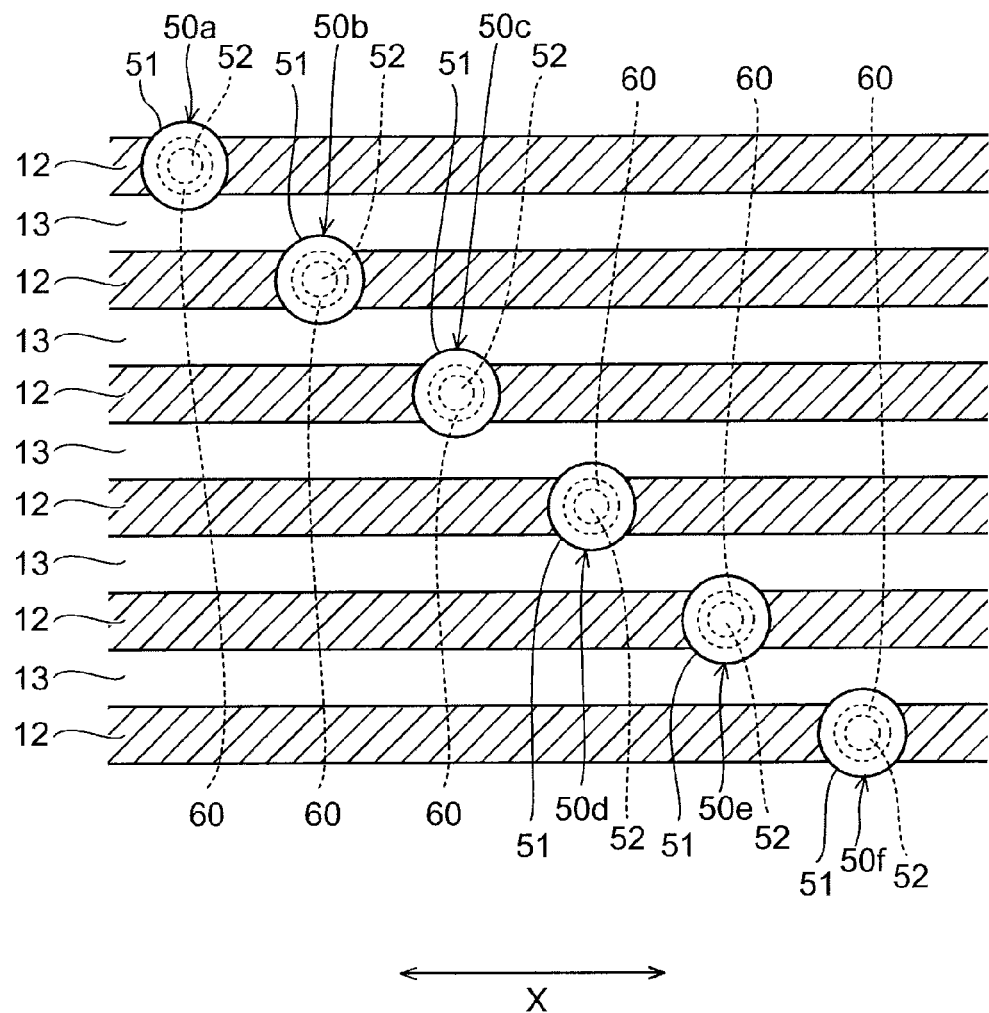
FIG. 4 is a schematic plan view showing positional relationship between vias and a lower layer interconnection in the staircase structure unit.

As shown in FIG. 4, a plurality of lower layer interconnections 12 corresponding to the number of layers of the back gate BG and the electrode layers WL extend along the X-direction under the stacked body. The lower layer interconnections 12 are metal interconnections, for example. An insulating film 13 is provided between the lower layer interconnections 12. Each of the lower layer interconnections 12 is connected to a circuit on the surface of the substrate 10 via a contact 15 penetrating through the insulating layer 11 shown in FIG. 3.

An etching stop layer 16 is provided on a layer having the lower layer interconnections 12 and the insulating films 13 formed thereon. The etching stop layer 16 is formed of a material different from a material of the insulating layer 42, the electrode layer WL, and the back gate BG, and a silicon nitride film can be used, for example.

On the etching stop layer 16, the back gate BG is provided via the insulating layer 42. On the back gate BG, a plurality of the insulating layers 42 and a plurality of the electrode layers WL are alternately stacked.

On the uppermost electrode layer WL at each step in the staircase structure unit 2, an inter-layer insulating film 17 is provided. A silicon oxide film, for example, can be used as the inter-layer insulating film 17.

The staircase structure unit 2 has a plurality of vias 50a to 50f provided therein. In the following description, the individual vias 50a to 50f may be collectively denoted by a reference numeral 50 without being distinguished from each other.

Each of the vias 50a to 50f is provided in a via hole 60 (shown in FIG. 8A) penetrating through the inter-layer insulating film 17 and the stacked body thereunder to reach the lower layer interconnection 12. Each of the electrode layers WL and the back gate BG spread in parallel to the XY plane in FIG. 1, with the columnar vias 50a to 50f extending along the Z-direction, penetrating through the electrode layers WL and the back gate BG.

Each of the vias 50a to 50f connects the uppermost electrode layer WL at each step of the staircase structure unit 2 and the lower layer interconnection 12.

For example, the uppermost electrode layer at the highest step of the staircase structure unit 2 shown in FIG. 3 is an electrode layer WL5, the sixth layer from the bottom including the back gate BG, with the via 50a connecting the electrode layer WL5 and the lower layer interconnection 12.

The uppermost electrode layer at the second highest step of the staircase structure unit 2 shown in FIG. 3 is an electrode layer WL4, the fifth layer from the bottom including the back gate BG, with the via 50b connecting the electrode layer WL4 and the lower layer interconnection 12.

The uppermost electrode layer at the third highest step of the staircase structure unit 2 shown in FIG. 3 is an electrode layer WL3, the fourth layer from the bottom including the back gate BG, with the via 50c connecting the electrode layer WL3 and the lower layer interconnection 12.

The uppermost electrode layer at the fourth highest step of the staircase structure unit 2 shown in FIG. 3 is an electrode layer WL2, the third layer from the bottom including the back gate BG, with the via 50d connecting the electrode layer WL2 and the lower layer interconnection 12.

The uppermost electrode layer at the fifth highest step of the staircase structure unit 2 shown in FIG. 3 is an electrode layer WL1, the second layer from the bottom including the back gate BG, with the via 50e connecting the electrode layer WL1 and the lower layer interconnection 12.

The uppermost electrode layer at the lowest step of the staircase structure unit 2 shown in FIG. 3 is the back gate BG, with the via 50f connecting the back gate BG and the lower layer interconnection 12.

Figure 8A:
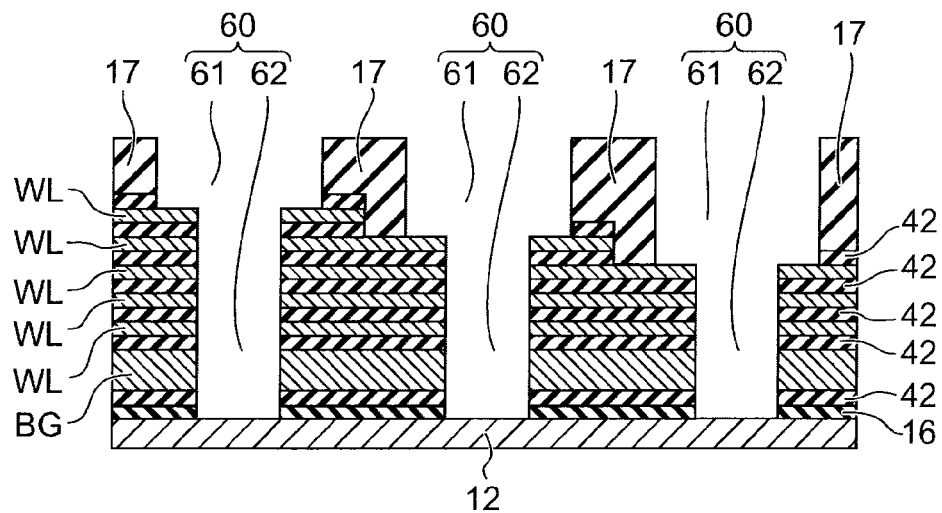

As shown in FIG. 8A, the via hole 60 has a first via hole 61 penetrating through the inter-layer insulating film 17 and a second via hole 62 being formed under the first via hole 61 in a manner connected thereto and having a smaller hole diameter (or width) than the first via hole 61. The uppermost electrode layer WL at each step is annularly exposed, for example, at the bottom of the first via hole 61.

The second via hole 62 penetrates through the stacked body under the first via hole 61 and reaches the lower layer interconnection 12. The cross section of the second via hole 62 is formed in a circular shape, for example, and the periphery of the second via hole 62 is surrounded by the plurality of electrode layers WL, the plurality of insulating layers 42, and the back gate BG.

The positions of the ends of the plurality of electrode layers WL on a side of the side wall of the second via hole 62 and the position of the end of the back gate BG on a side of the side wall of the second via hole 62 are aligned in a stacking direction of the plurality of electrode layers WL and the back gate BG. Therefore, directly burying the via 50 into the second via hole 62 results in that the via 50 is also connected to the electrode layers WL other than the uppermost layer and the back gate BG. According to the embodiment, therefore, an insulating film 18 is provided on the side wall of the second via hole 62 as shown in FIG. 3. A silicon oxide film, for example, can be used as the insulating film 18.

The via 50 has an upper part 51 provided in the first via hole 61 and a penetrating part 52 provided in the second via hole 62. The upper part 51 and the penetrating part 52 are provided integrally and continuously using a same material, both formed in a columnar shape, for example. The penetrating part 52 has a smaller diameter or width than the upper part 51, and the penetrating part 52 is thinner than the upper part 51.

The upper part 51 is provided in contact with and on a top face of the uppermost electrode layer WL or the back gate BG at each step. The lower face at the peripheral side of the upper part 51 is in contact with the top face of the uppermost electrode layer WL or the back gate BG. The contact face between the upper part 51 and the uppermost electrode layer WL or the back gate BG is annularly formed.

The penetrating part 52 is provided inside the insulating film 18 in the second via hole 62, and connects the upper part 51 and the lower layer interconnection 12. The insulating film 18 is provided between the electrode layer WL and the back gate BG surrounding the side wall of the second via hole 62, and the penetrating part 52, with the region therebetween being insulated. Therefore, each via 50 connects only the uppermost electrode layer WL or the back gate BG to the corresponding lower layer interconnection 12.

A metal material can be used for the via 50. For example, the via 50 can include barrier metal and buried metal. Barrier metal having adhesiveness and a functionality of preventing metal diffusion is formed on the inner wall of the via hole 60, and buried metal having a superior embedability is buried inside the barrier metal. Titanium nitride, for example, can be used as the barrier metal and tungsten can be used as the buried metal.

The via 50 is connected to the lower layer interconnection 12 which is a metal interconnection. The lower layer interconnection 12, extending between a region where the staircase structure unit 2 is provided (contact region) and a region where a control circuit is provided (circuit region) on the substrate 10, is connected, in the circuit region, to a source region or a drain region of a transistor in the control circuit, for example.

Therefore, the electrode layer WL and the back gate BG of each layer are connected to the control circuit through the via 50 and the lower layer interconnection 12. In other words, a desired potential is applied to each electrode layer WL and the back gate BG of the memory cell array 1, via the lower layer interconnection 12 and the via 50.

Next, a method for manufacturing the staircase structure unit 2 of the first embodiment will be described, referring to FIGS. 5A to 9B. FIGS. 5A to 9B show, for example, three steps from the top of the staircase structure unit 2 shown in FIG. 3.

On the substrate 10, the insulating layer 11, the lower layer interconnection 12, and the etching stop layer 16 are formed in this order. On the etching stop layer 16, the back gate BG is formed via the insulating layer 42.

On the back gate BG, a stacked body is formed by alternately stacking a plurality of insulating layers 42 and a plurality of electrode layers WL and includes the plurality of insulating layers 42 and the plurality of electrode layers WL. The back gate BG, the insulating layers 42 and the electrode layers WL are formed by chemical vapor deposition (CVD), for example.

Figure 5A:
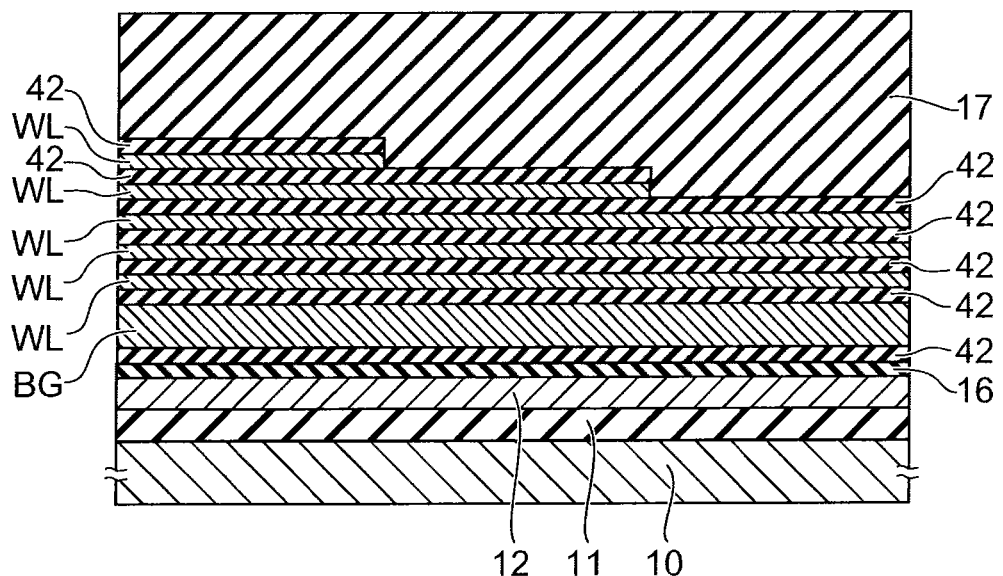
FIGS. 5A to 9B are schematic sectional views showing a method for manufacturing the semiconductor device of the first embodiment.

The memory cell array 1 shown in FIG. 1 is formed in the memory cell array region on the stacked body including the plurality of insulating layers 42 and the plurality of electrode layers WL. Processing of the staircase structure is then performed in the contact region, as shown in FIG. 5A.

Specifically, a slimming process of reducing the planar size of an unillustrated resist film, and a process of etching a single layer of insulating layers 42 and a single layer of electrode layers WL, respectively, using the resist film as a mask, are repeated a plurality of times.

After having processed the electrode layer WL into a staircase shape, the inter-layer insulating film 17 is buried and flattened on the staircase structure unit.

Silicon, for example, can be used as the material of the back gate BG and the electrode layer WL. Silicon oxide, for example, can be used as the material of the insulating layer 42 and the inter-layer insulating film 17. As the material of the etching stop layer 16, a material such as silicon nitride can be used, for example, which is different from a material of the back gate BG, the electrode layer WL, the insulating layer 42, and the inter-layer insulating film 17.

Figure 5B:
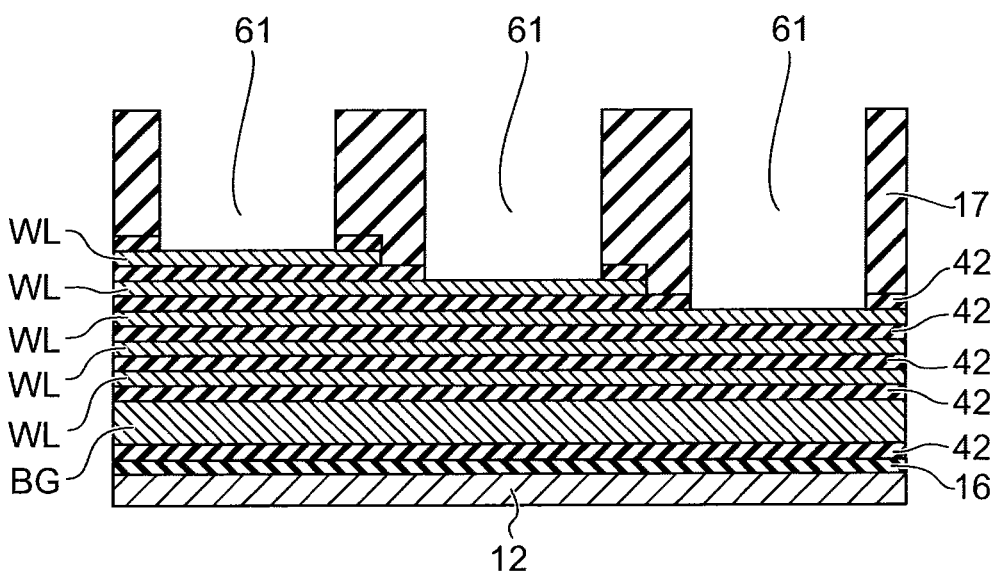

After having formed the inter-layer insulating film 17, the first via hole 61 reaching the uppermost electrode layer WL at each step of the staircase structure unit is formed on the inter-layer insulating film 17 and the uppermost insulating layer 42, as shown in FIG. 5B. The uppermost electrode layer WL of each step is exposed at the bottom of the first via hole 61. The first via hole 61 is formed by reactive ion etching (RIE) using an unillustrated resist film as a mask, for example. A plurality of first via holes 61 are formed simultaneously and collectively.

Figure 6A:
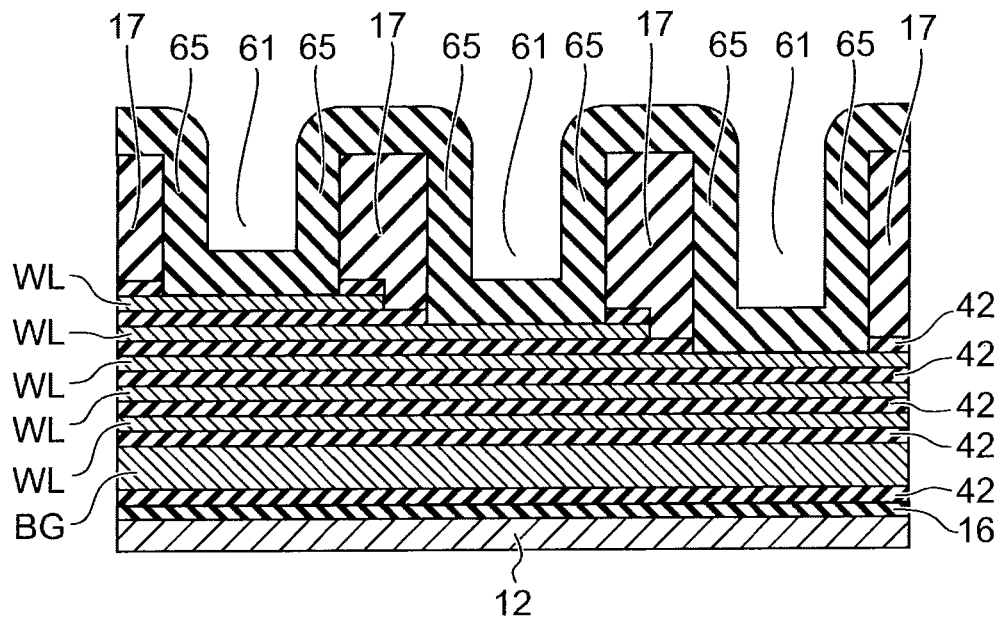

After having formed the first via hole 61, a side wall film 65 is conformally formed on the inter-layer insulating film 17 and on the inner wall of the first via hole 61, as shown in FIG. 6A. A silicon nitride film, for example, can be used as the side wall film 65. The side wall film 65 is formed by CVD, for example.

The first via hole 61 has a space remaining therein which is not completely filled with the side wall film 65 and is narrower than the width of the first via hole 61 inside the side wall film 65 in the first via hole 61.

Figure 6B:
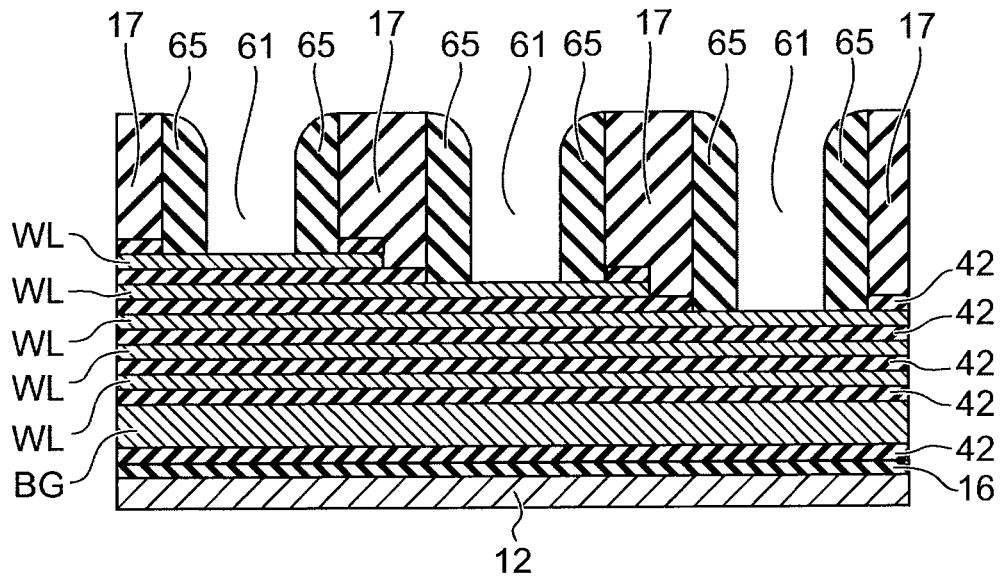

Next, the side wall film 65 is etched back by RIE to remove the side wall film 65 at the bottom of the first via hole 61. In addition, the side wall film 65 on the top face of the inter-layer insulating film 17 is also removed. In other words, the side wall film 65 is left on the side wall of the first via hole 61, as shown in FIG. 6B. The width of the first via hole 61 has been narrowed by a width of about twice the film thickness of the side wall film 65. At the bottom of the first via hole 61, the uppermost electrode layer WL at each step is exposed.

Figure 7A:
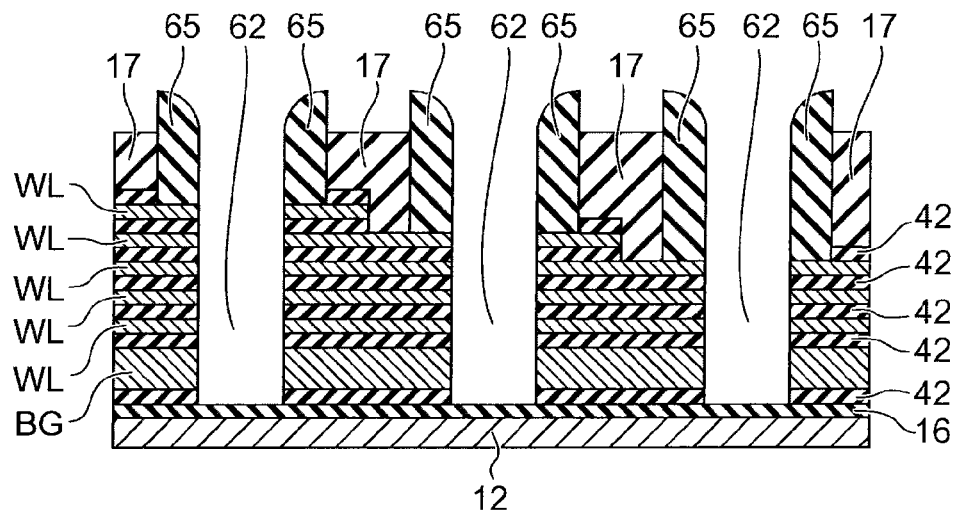

Subsequently, the second via hole 62 shown in FIG. 7A is formed on the stacked body under the first via hole 61 by RIE using the side wall film 65 left on the side wall of the first via hole 61 and the inter-layer insulating film 17 as a mask. The plurality of second via holes 62 are formed simultaneously and collectively.

A condition (type of gas, etc.) is set for etching the electrode layer WL, the back gate BG, and the insulating layer 42 while having selectivity with respect to the side wall film 65. When etching the insulating layer 42, the inter-layer insulating film 17 formed of the same material as the material of the insulating layer 42 is also consumed. However, since the inter-layer insulating film 17 is thicker than the total film thickness of all the insulating layers 42 in the stacked body, only a part of the top face is removed.

In addition, the etching can be stopped in a well-controlled manner using the etching stop layer 16 formed of the same material as the material of the side wall film 65. Therefore, the bottom of the second via hole 62 reaches the etching stop layer 16.

Figure 7B:
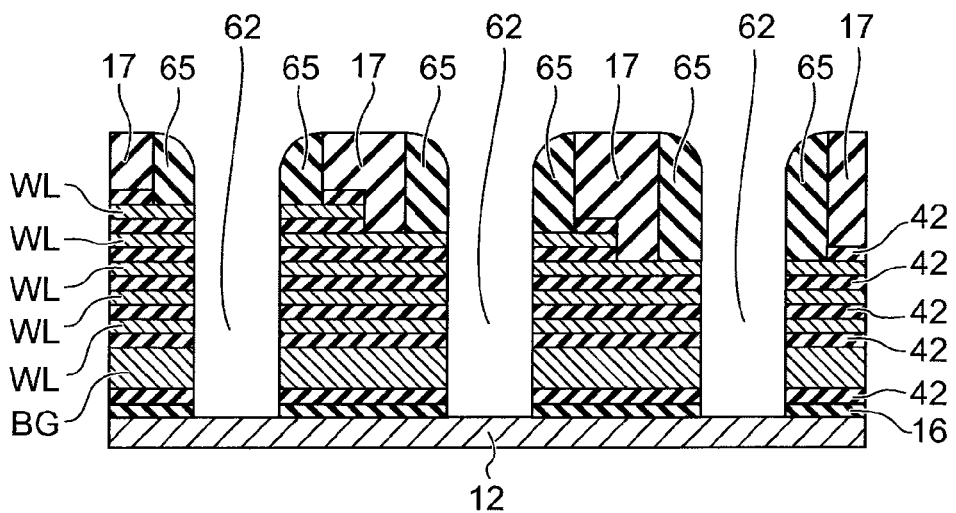

Subsequently, RIE is performed on the etching stop layer 16, and the etching stop layer 16 at the bottom of the second via hole 62 is removed, as shown in FIG. 7B. Accordingly, the lower layer interconnection 12 is exposed at the bottom of the second via hole 62.

Furthermore, RIE is continued to remove the side wall film 65 formed of the same material as the material of the etching stop layer 16, as shown in FIG. 8A.

Accordingly, the first via hole 61 and the second via hole 62 having a hole diameter smaller than the first via hole 61 are connected in series to form a via hole 60. The top face of the uppermost electrode layer WL of each step is annularly exposed at the bottom of the first via hole 61.

Figure 8B:
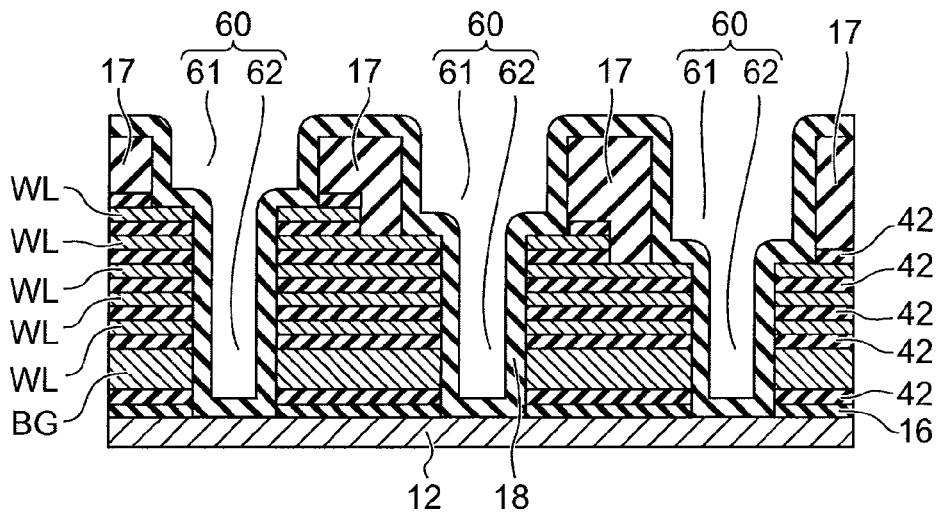

The insulating film 18 is conformally formed on the inner wall (side wall and bottom) of the via hole 60 and on the inter-layer insulating film 17, as shown in FIG. 8B. A silicon oxide film, for example, can be used as the insulating film 18.

Subsequently, the insulating film 18 is etched back by RIE to remove the insulating film 18 at the bottom of the second via hole 62. In addition, a part of the insulating film 18 on the electrode layer WL at the bottom of the first via hole 61 is also removed.

Figure 9A:
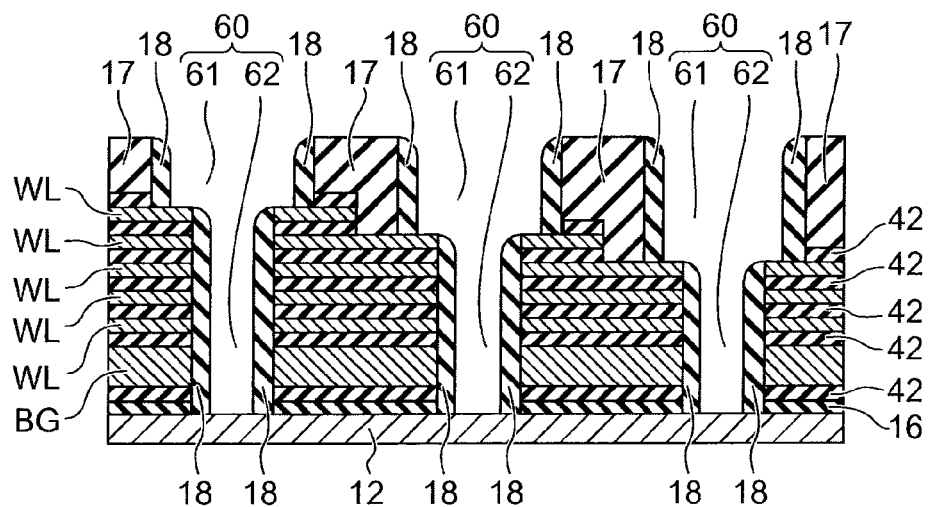

Therefore, the lower layer interconnection 12 is exposed at the bottom of the second via hole 62, as shown in FIG. 9A. Furthermore, the uppermost electrode layer WL of each step is annularly exposed at a part of the internal circumference at the bottom of the first via hole 61.

An end on the side of the second via hole 62 in each of the electrode layers WL and the back gate BG is covered with the insulating film 18 and is not exposed to the second via hole 62.

Figure 9B:
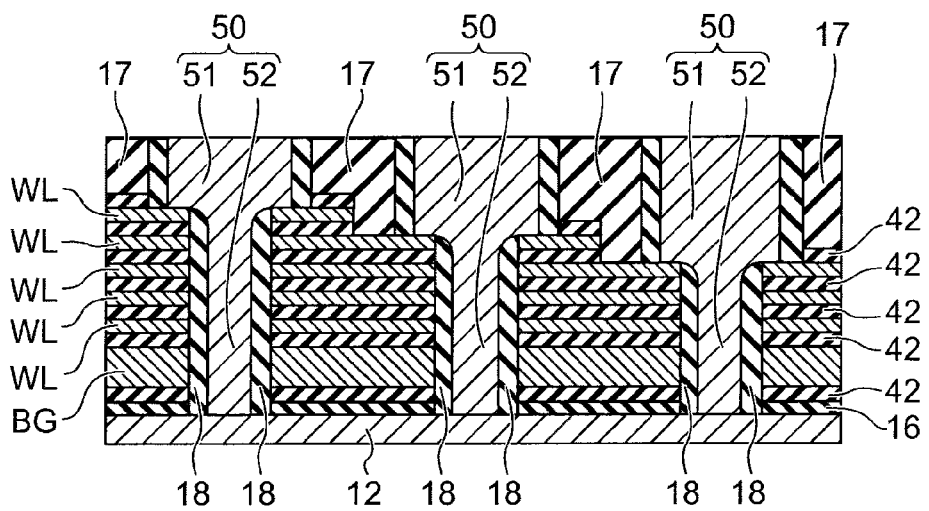

The via hole 60 has the via 50 buried therein, as shown in FIG. 9B. The via 50 has a structure in which the upper part 51 and the penetrating part 52 formed of a same material are integrally continued.

First, the penetrating part 52 is buried inside the insulating film 18 in the second via hole 62 and, subsequently, the upper part 51 is buried on the penetrating part 52 and inside the first via hole 61. The lower end of the penetrating part 52 is in contact with the lower layer interconnection 12, and the lower face of the upper part 51 is in contact with the top face of the uppermost electrode layer WL at each step.

After having buried the via 50 in the via hole 60, the top face of the via 50 is flattened by chemical mechanical polishing (CMP), for example. Heights of the top face of respective vias 50 from the lower layer interconnection 12 are made uniform.

A via 50 provided at a higher step in the staircase structure has a shorter dimension in the height direction (depth direction) of the first via 51 and a longer dimension in the height direction (depth direction) of the second via 52. Dimensions in the radial direction (width direction) of respective first vias 51 are approximately the same. Dimensions in the radial direction (width direction) of respective second vias 52 are approximately the same.

Here, as a comparative example, a structure is conceivable in which the uppermost electrode layer of each step is connected to an upper layer interconnection formed above the stacked body through the via formed on the inter-layer insulating film. However, with the structure, the upper layer interconnection is connected to a control circuit formed on the substrate surface, and thus a via is formed which penetrates through a relatively thick part from the layer provided with the upper layer interconnection to the substrate, which may increase process difficulty.

On the contrary, according to the embodiment, the electrode layer WL and the back gate BG at each step can be drawn out not on the stacked body but under the stacked body through the via 50 penetrating through the stacked body. In other words, the electrode layer WL and the back gate BG at each step can be directly drawn out toward the substrate 10 without being drawn around on the stacked body, and can be easily connected to the control circuit formed on the surface of the substrate 10.

The second via hole 62 reaching the lower layer interconnection 12 is not opened from the inter-layer insulating film 17 above the stacked body including the electrode layer WL, but formed from the uppermost electrode layer WL at each step toward the lower layer interconnection 12. In other words, the length by which the second via hole 62 must penetrate through can be shortened, and whereby the hole diameter of the second via hole 62 can be reduced while preventing increase of the aspect ratio.

Therefore, the hole diameter of the second via hole 62 can be reduced without increasing the difficulty of processing. Reduction of the contact area between the via 50 and the lower layer interconnection 12 can be achieved by reducing the hole diameter of the second via hole 62. Therefore, reduction of respective widths of a plurality of lower layer interconnections 12 formed corresponding to the plurality of vias 50 can be achieved, and reduction of the area of the region where the plurality of lower layer interconnections 12 are formed can be achieved.

Figure 10:
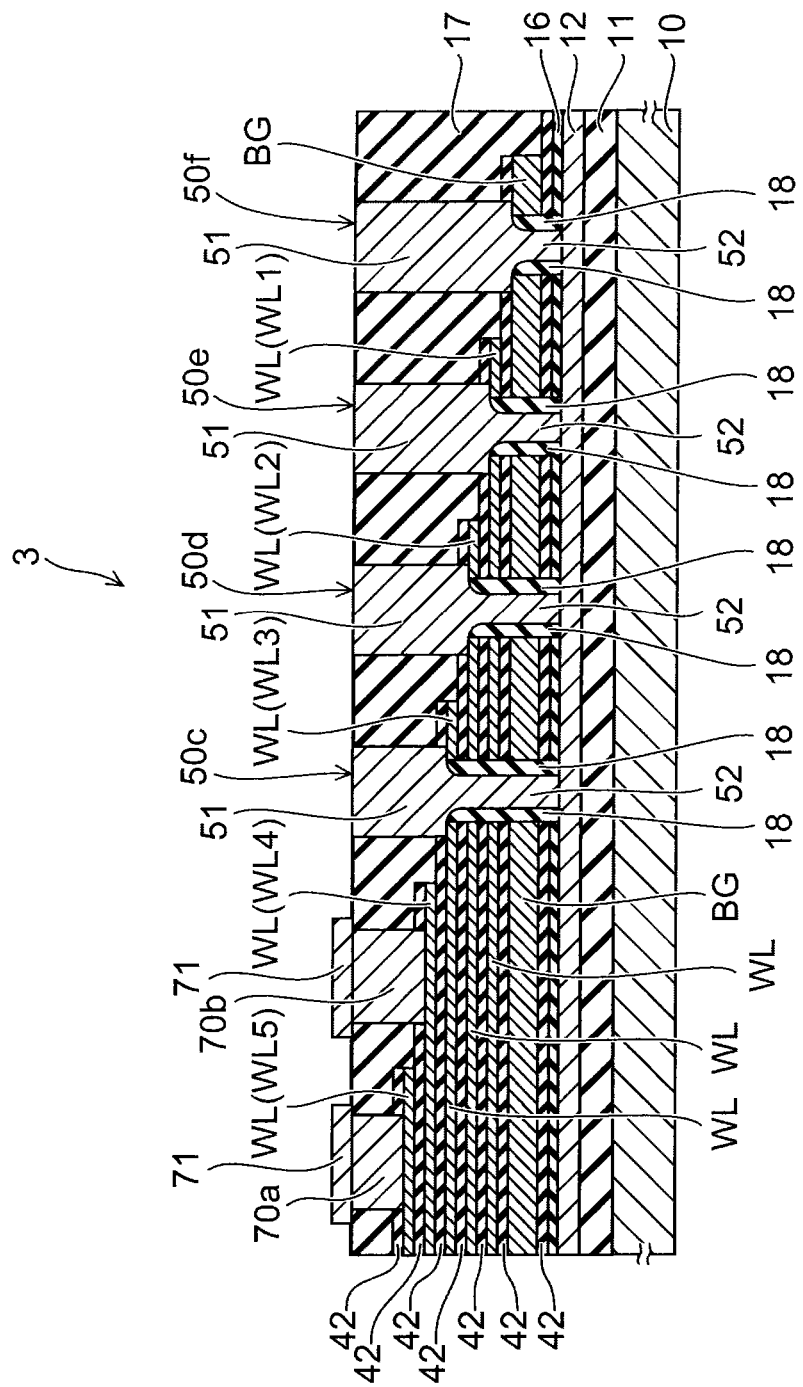
FIG. 10 is a schematic sectional view of a staircase structure unit of a semiconductor device of a second embodiment.

Next, FIG. 10 is a schematic cross-sectional view of the staircase structure unit 3 of a second embodiment.

In a staircase structure unit 3 of the second embodiment, vias provided at a relatively lower step (e.g., the fours vias 50c to 50f from the bottom to the fourth step in FIG. 10), among the plurality of vias, are connected to the lower layer interconnection 12 through the penetrating part 52 penetrating through the stacked body under the uppermost electrode layer WL or the back gate BG, similarly to the first embodiment.

On the other hand, upper layer vias (e.g., via 70a at the highest step and via 70b at the second highest step in FIG. 10), provided at relatively higher step are connected to an upper layer interconnection 71 provided on the stacked body and the inter-layer insulating film 17.

An inter-layer insulating film 75 is further formed on the flattened top face of the via 50c, 50d, 50e 50f, 70a, 70b and the inter-layer insulating film 17, as shown in FIG. 10. Vias 72 are buried in the inter-layer insulating film 75. The vias 72 are provided on the vias 70a and 70b. A silicon oxide film, for example, can be used as the inter-layer insulating film 75.

The upper layer interconnection 71 is formed on the inter-layer insulating film 75 in contact with the vias 72. Accordingly, the upper layer vias 70a and 70b are connected to the upper layer interconnection 71 through the via 72.

A plurality (two, in FIG. 10) of upper layer interconnections 71 are provided on the inter-layer insulating film 75, corresponding to each of the upper layer vias 70a and 70b. The upper layer vias 70a and 70b, respectively penetrating through the inter-layer insulating film 17, are connected to the vias 72. The vias 72, respectively penetrating through the inter-layer insulating film 75, are connected to the upper layer interconnection 71. The upper layer vias 70a and 70b are formed of a metal material, similarly to the vias 50c to 50f, and the upper layer interconnection 71 is a metal interconnection.

In addition, the upper layer via 70a is provided on the top face of the uppermost electrode layer WL in FIG. 10 and is in contact with the top face thereof. The upper layer via 70b is provided on the top face of the electrode layer WL at the second highest step in FIG. 10, and is in contact with the top face thereof.

The upper layer interconnection 71 is electrically connected by a via penetrating through the layer between the upper layer interconnection 71 and the control circuit in a region where a control circuit is formed on the substrate 10.

Connecting a plurality of vias separately to the lower layer interconnection 12 and the upper layer interconnection 71 which are formed on different layers instead of connecting all the vias to a interconnection formed on a same layer allows contact parts between interconnections and vias to be formed separately on different layers. As a result, the degree of freedom of interconnection layout can be increased and, additionally reduction in the planar size of the entire chip can also be achieved.

FIGS. 11A to 14B are schematic cross-sectional views showing a method for manufacturing the staircase structure unit 3 of the second embodiment.

After having formed the first via hole 61, similarly to the first embodiment, the side wall film 65 is conformally formed on the inter-layer insulating film 17 and on the inner wall of the first via hole 61.

The side wall film 65 is then selectively removed by RIE using a resist film as a mask, for example, leaving the side wall film 65 on the side wall of the first via hole 61.

Figure 11A:
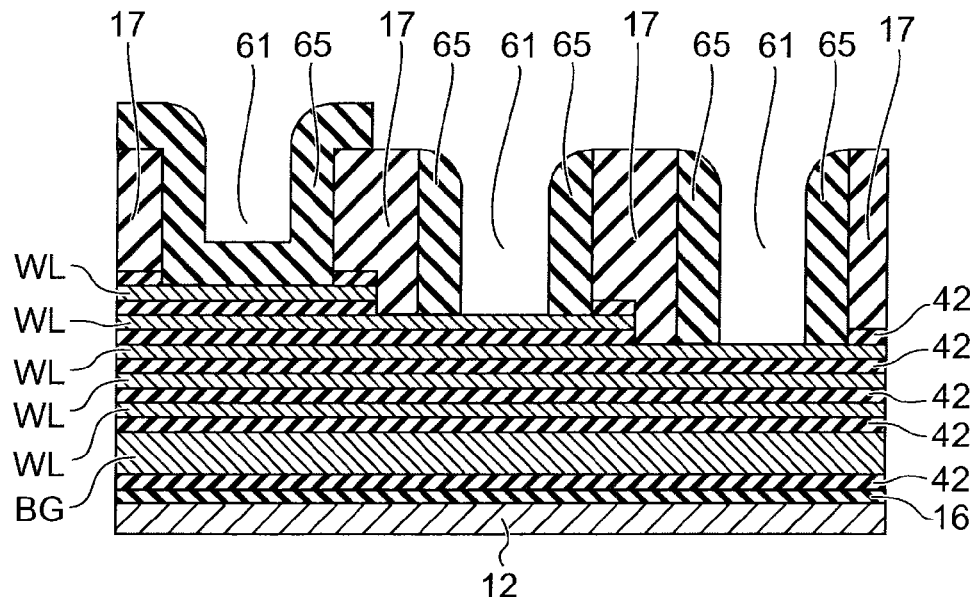
FIGS. 11A to 14B are schematic sectional views showing a method for manufacturing the semiconductor device of the second embodiment.

In this occasion, in the second embodiment, as shown in FIG. 11A, the side wall film 65 is also left on the bottom of the first via hole 61 at a step where an upper layer interconnection connecting to the upper layer via is formed.

At a step where a via connecting to the lower layer interconnection is formed, the side wall film 65 is left only on the side wall of the first via hole 61, with the side wall film 65 at the bottom of the first via hole 61 being removed and the uppermost electrode layer WL being exposed.

Figure 11B:
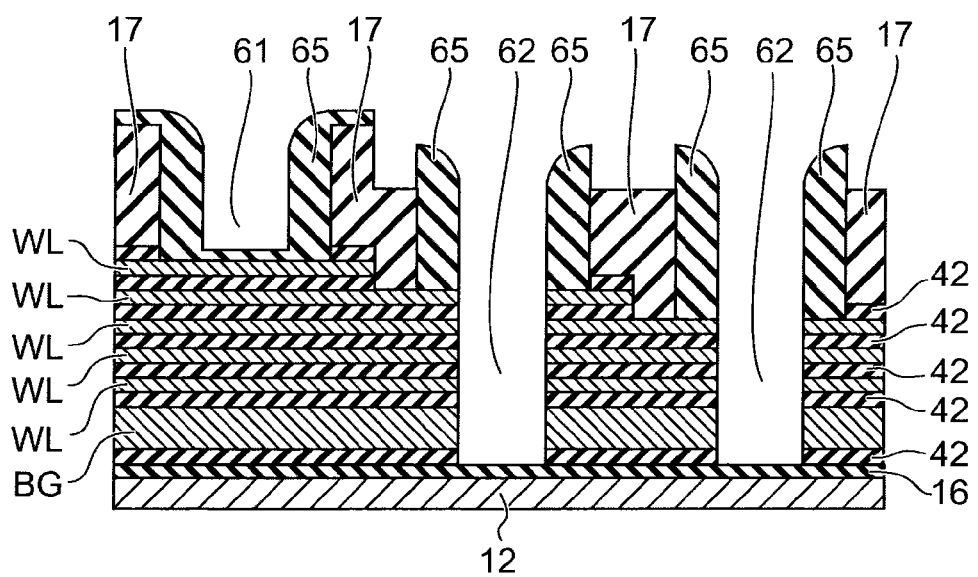

The second via hole 62 shown in FIG. 11B is formed on the stacked body under the first via hole 61 by RIE using the side wall film 65 and the inter-layer insulating film 17 as a mask.

The second via hole 62 is formed on a stacked body at a step where the top face is not covered with the side wall film 65. The second via hole 62 is not formed on a stacked body at a step where the side wall film 65 is provided at the bottom of the first via hole 61, with the side wall film 65 of the bottom being a mask.

Figure 12A:
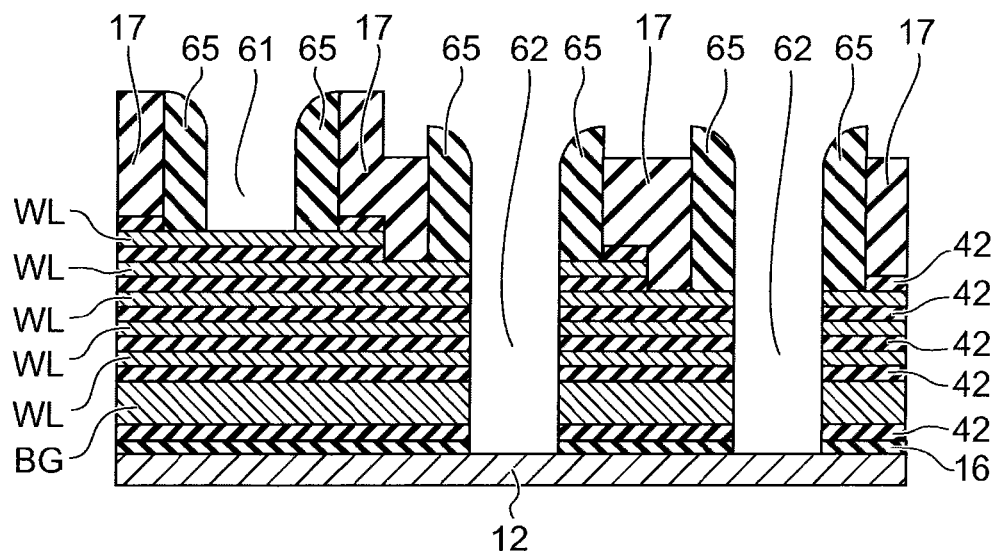

The bottom of the second via hole 62 reaches the etching stop layer 16. Subsequently, RIE is performed on the etching stop layer 16 and, as shown in FIG. 12A, the etching stop layer 16 at the bottom of the second via hole 62 is removed. Accordingly, the lower layer interconnection 12 is exposed at the bottom of the second via hole 62.

The side wall film 65 and the etching stop layer 16 are formed of a same material. Therefore, when etching is performed to remove the etching stop layer 16, the side wall film 65 remaining at the bottom of the first via hole 61 at a higher step is also removed, thereby exposing the uppermost electrode layer WL at the step.

Figure 12B:
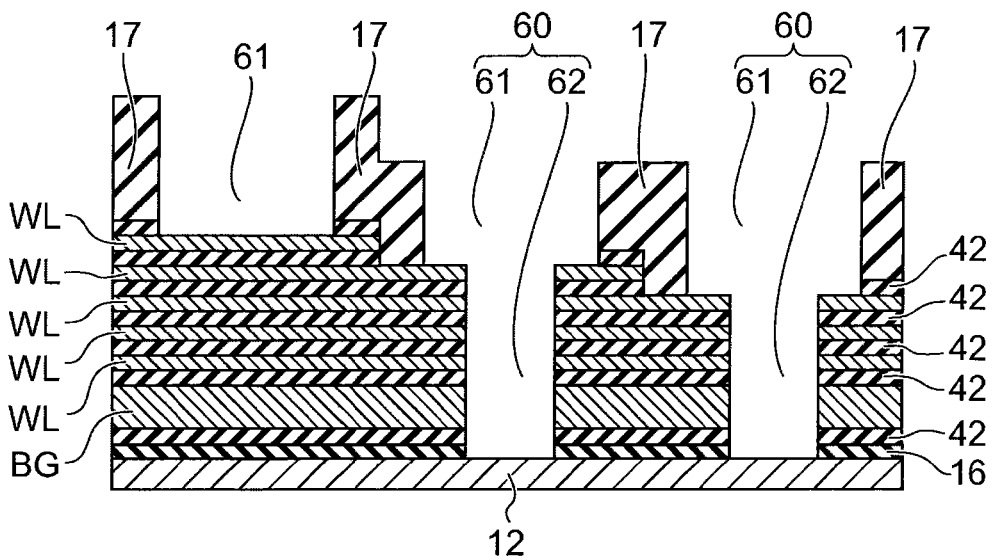

Further continuing RIE, the side wall film 65 is removed as shown in FIG. 12B. Accordingly, the first via hole 61 and the second via hole 62 having a smaller hole diameter than the first via hole 61 are connected in series to form a via hole 60 at the step where the second via hole 62 has been formed. Only the first via hole 61 is formed at a step where the second via hole 62 has not been formed.

Figure 13A:
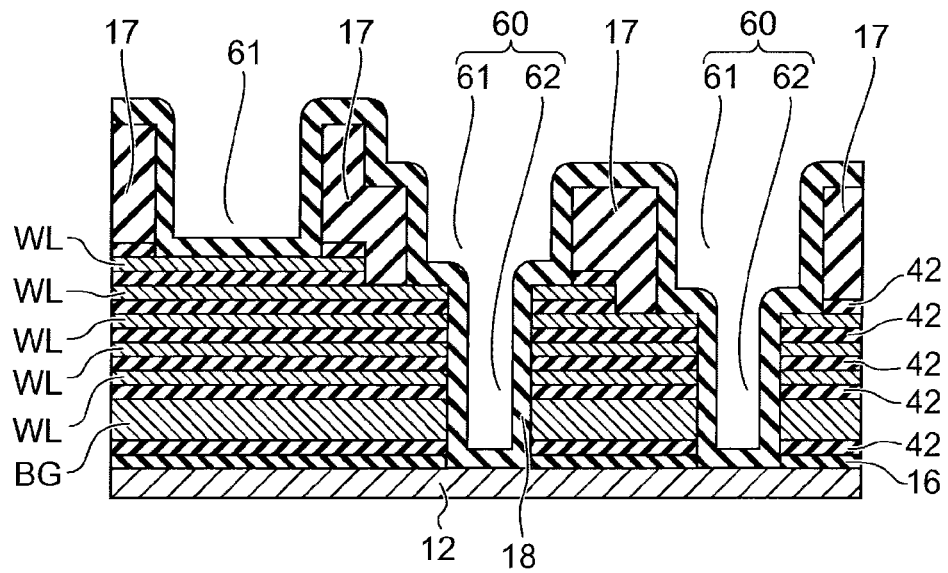

The insulating film 18 is conformally formed on the inner wall of the first via hole 61 at a higher step, on the inner wall of the via hole 60 at a step which is lower than the higher step, and on the inter-layer insulating film 17, as shown in FIG. 13A.

Subsequently, the insulating film 18 is etched back by RIE to remove the insulating film 18 on the bottom of the first via hole 61 at the higher step, and the insulating film 18 on the bottom of the second via hole 62 at a step lower than the higher step. In addition, a part of the insulating film 18 on the electrode layer WL at the bottom of the first via hole 61 continuing onto the second via hole 62 is also removed.

Figure 13B:
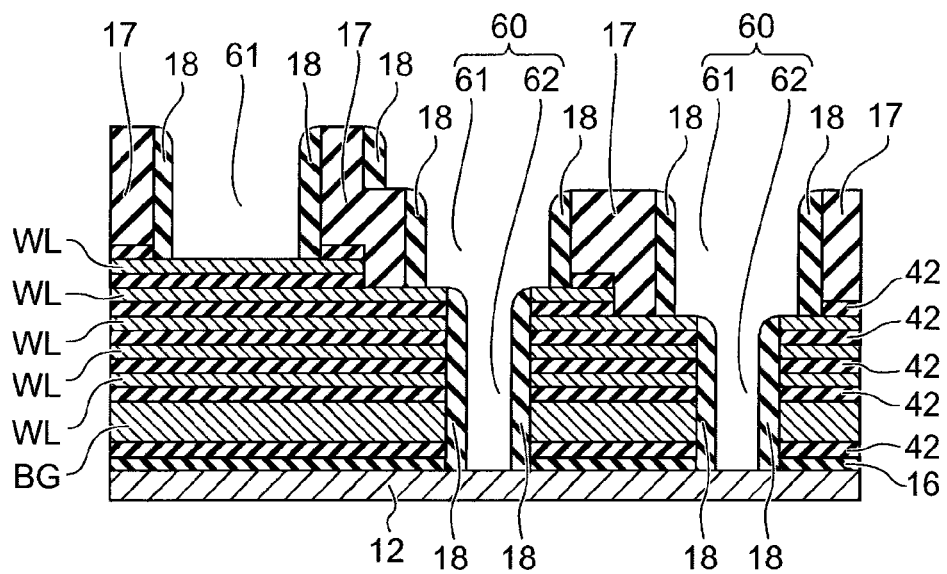

Therefore, as shown in FIG. 13B, the lower layer interconnection 12 is exposed at the bottom of the second via hole 62. The uppermost electrode layer WL at each step is annularly exposed at a part of the internal circumference on the bottom of the first via hole 61 continuing onto the second via hole 62. At the bottom of the first via hole 61 at a higher step where the second via hole 62 has not been formed, the uppermost electrode layer WL at the step is exposed.

An end on the side of the second via hole 62 in each of the electrode layers WL and the back gate BG is covered with the insulating film 18 and is not exposed to the second via hole 62.

Figure 14A:
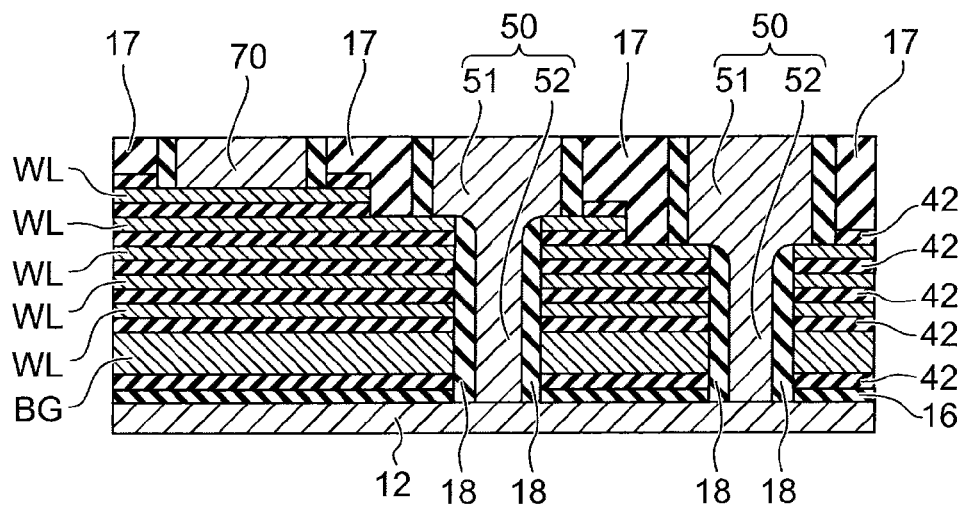

The via hole 60 has the via 50 buried therein, similarly to the first embodiment, as shown in FIG. 14A. The via 50 has a structure in which the upper part 51 and the penetrating part 52 formed of a same material are integrally continued.

The first via hole 61 at the higher step has a via 70 buried therein. The via 70 and the via 50 are simultaneously formed using a same material. The upper part 51 of the via 50 and the via 70 are formed in a columnar shape having approximately a same thickness, for example.

After having buried the vias 50 and 70 in respective corresponding via holes, the top face of the via 50, the via 70, and the inter-layer insulating film 17 are flattened by CMP, for example. Heights of the top face of the via 50 and the via 70 from the lower layer interconnection 12 are made uniform.

Figure 14B:
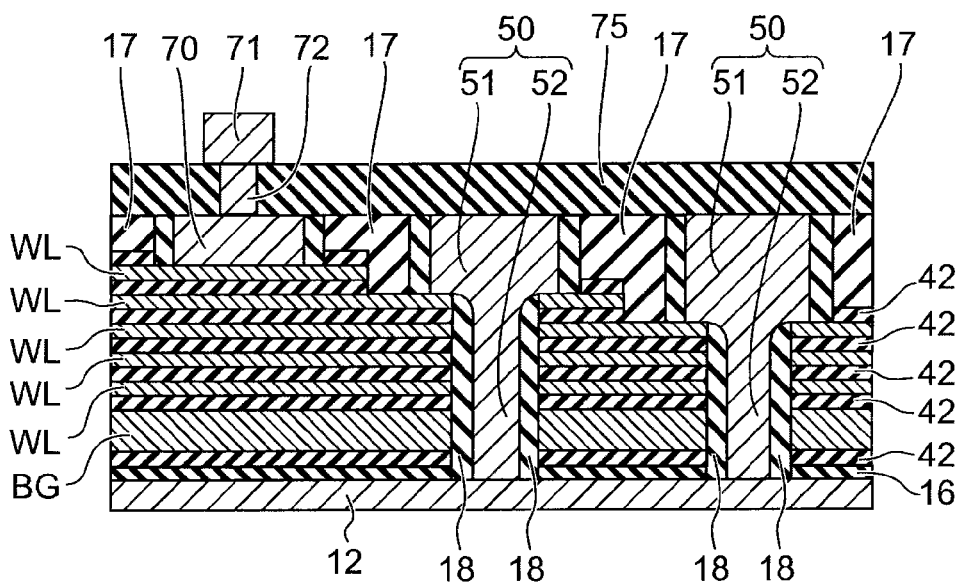

An inter-layer insulating film 75 is further formed on the flattened top face of the via 50, the via 70, and the inter-layer insulating film 17, as shown in FIG. 14B, with a via 72 being buried in the inter-layer insulating film 75. A silicon oxide film, for example, can be used as the inter-layer insulating film 75.

The upper layer interconnection 71 is formed on the inter-layer insulating film 75 in contact with the via 72. Accordingly, the upper layer via 70 is connected to the upper layer interconnection 71 through the via 72.

According to the second embodiment, the via is drawn out above the stacked body and connected to the upper layer interconnection, at a higher step where the stacked body is relatively thick. In other words, a via hole penetrating through a thick part of the stacked body which tends to increase the difficulty of processing is not formed.

Although it is assumed in each embodiment described above that the lower layer interconnection is the lower layer connection object of vias, the vias may be directly connected to a circuit formed on the substrate surface.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a lower layer connection object;
   a stacked body having a plurality of insulating layers and a plurality of electrode layers alternately stacked on the lower layer connection object, the stacked body having a staircase structure unit in which the plurality of electrode layers are processed into a staircase shape;
   an insulating film provided on a side wall of a via hole penetrating through the staircase structure unit to reach the lower layer connection object; and
   a via connecting uppermost electrode layer at each step of the staircase structure unit and the lower layer connection object through the via hole,
   the via having:
   an upper part provided on and in contact with a top face of the uppermost electrode layer; and
   a penetrating part provided to be thinner than the upper part inside the insulating film in the via hole, the penetrating part connecting the upper part and the lower layer connection object.

2. The semiconductor device according to claim 1, wherein positions of ends of the plurality of electrode layers on a side of the side wall of the via hole are aligned in a stacking direction of the plurality of electrode layers.

3. The semiconductor device according to claim 1, further comprising:
   a memory film including a charge storage film, provided on a side wall of a hole penetrating through the stacked body; and
   a channel body provided inside the memory film in the hole.

4. The semiconductor device according to claim 3, wherein the stacked body has:
   a memory cell array region having the memory film and the channel body provided therein; and
   a contact region provided outside the memory cell array region and having the staircase structure unit provided therein.

5. The semiconductor device according to claim 1, further comprising a substrate having a circuit on a surface thereof, wherein
   the lower layer connection object is provided between the stacked body and the substrate, and is a metal interconnection connected to the circuit.

6. The semiconductor device according to claim 1, further comprising an etching stop layer provided between the lower layer connection object and the stacked body, and formed of a material different from a material of the insulating layer and the electrode layer.

7. The semiconductor device according to claim 1, further comprising an inter-layer insulating film provided on the uppermost electrode layer.

8. The semiconductor device according to claim 1, wherein the electrode layer and the insulating layer surround a periphery of the penetrating part of the via.

9. The semiconductor device according to claim 1, wherein the upper part and the penetrating part of the via are provided integrally and continuously, using a same material.

10. The semiconductor device according to claim 1, wherein a contact face between the upper part of the via and the uppermost electrode layer is annular.

11. The semiconductor device according to claim 1, further comprising:
    an upper layer connection object provided on the stacked body; and
    an upper layer via provided on an uppermost electrode layer at a step higher than a step on which the via is provided, the upper layer via connecting the uppermost electrode layer of the higher step and the upper layer connection object.

12. The semiconductor device according to claim 1, wherein the via provided at a higher step in the staircase structure unit has a smaller size in a height direction of the upper part.

13. The semiconductor device according to claim 1 wherein the via provided at a higher step in the staircase structure unit has a larger size in a height direction of the penetrating part.

* * * * *